US010333038B2

(12) United States Patent
Fujimoto et al.

(10) Patent No.: US 10,333,038 B2
(45) Date of Patent: Jun. 25, 2019

(54) LED MODULE AND METHOD FOR MANUFACTURING LED MODULE

(71) Applicant: TORAY ENGINEERING CO., LTD., Tokyo (JP)

(72) Inventors: Takayoshi Fujimoto, Kusatsu (JP); Masamichi Yamashita, Otsu (JP); Masaki Mori, Yasu (JP); Yutaka Oka, Kisarazu (JP)

(73) Assignee: TORAY ENGINEERING CO., LTD., Tokyo (JP)

(*) Notice: Subject to any disclaimer, the term of this patent is extended or adjusted under 35 U.S.C. 154(b) by 0 days.

(21) Appl. No.: 15/562,024

(22) PCT Filed: Mar. 23, 2016

(86) PCT No.: PCT/JP2016/059128
§ 371 (c)(1),
(2) Date: Sep. 27, 2017

(87) PCT Pub. No.: WO2016/158601
PCT Pub. Date: Oct. 6, 2016

(65) Prior Publication Data
US 2018/0108821 A1  Apr. 19, 2018

(30) Foreign Application Priority Data
Mar. 27, 2015  (JP) ................. 2015-066031

(51) Int. Cl.
*H01L 33/02*  (2010.01)
*H01L 33/52*  (2010.01)
(Continued)

(52) U.S. Cl.
CPC .............. *H01L 33/60* (2013.01); *H01L 33/52* (2013.01); *H01L 33/54* (2013.01); *H01L 33/62* (2013.01);
(Continued)

(58) Field of Classification Search
CPC ......... H01L 33/10; H01L 33/22; H01L 33/42; H01L 33/44; H01L 33/405;
(Continued)

(56) References Cited

U.S. PATENT DOCUMENTS 9,431,589 B2   8/2016  Loh et al.
2003/0151361 A1  8/2003  Ishizaka
(Continued)

FOREIGN PATENT DOCUMENTS

JP  2003-234509 A   8/2003
JP  2011-129790 A   6/2009
(Continued)

OTHER PUBLICATIONS

International Search Report dated Apr. 19, 2016 for application PCT/JP2016/059128.

*Primary Examiner* — Natalia A Gondarenko
(74) *Attorney, Agent, or Firm* — Westerman, Hattori, Daniels & Adrian, LLP

(57) ABSTRACT

In an LED module, modes to solve such a problem that a loss in the output of light discharged into the atmosphere occurs are embodied. Specifically, in an LED module in which an LED chip is sealed with a sealing resin, a surface of the sealing resin is covered with a thin film, the thin film is made of a material having a smaller linear expansion coefficient than the sealing resin, and an irregular surface is provided on a surface of the thin film such that light from the LED chip is multiply reflected.

2 Claims, 2 Drawing Sheets

(51) Int. Cl.
*H01L 33/60* (2010.01)
*H01L 33/62* (2010.01)
*H01L 21/00* (2006.01)
*H01L 21/314* (2006.01)
*H01L 21/316* (2006.01)
*H01L 21/56* (2006.01)
*H01L 33/54* (2010.01)
H01L 33/44 (2010.01)
H01L 33/48 (2010.01)
H01L 33/58 (2010.01)
H01L 21/31 (2006.01)

(52) U.S. Cl.
CPC .............. *H01L 33/44* (2013.01); *H01L 33/58* (2013.01); *H01L 2224/48091* (2013.01); *H01L 2224/49107* (2013.01)

(58) Field of Classification Search
CPC ........ H01L 33/48–33/648; H01L 33/60; H01L 33/52; H01L 33/56; H01L 33/62; H01L 27/156; H01L 2933/0033; H01L 2933/005; H01L 2933/0066–2933/0091; H01L 23/29–295; H01L 23/3142; H01L 23/3135; H01L 23/315; H01L 23/49503–23/49513; H01L 21/4807; H01L 21/54; H01L 21/56–21/568; H01L 33/46; H01L 33/483; H01L 33/508; H01L 27/14629; H01L 21/02123; H01L 21/02164; H01L 21/02225; H01L 21/02227; H01L 21/02255; H01L 21/02345; H01L 21/02356; H01L 21/0243; H01L 21/31058; H01L 21/31608; H01L 21/67306; H01L 21/67336; H01L 23/28; H01L 23/293; H01L 23/296; H01L 23/3157; H01L 23/3192; H01L 23/345; H01L 23/5329; H01L 23/53295; H01L 31/0203; H01L 31/0216; H01L 31/0236; H01L 51/0003; H01L 51/0015; H01L 51/107; H01L 51/42; H01L 51/448; H01L 51/50; H01L 51/5237; H01L 51/524; H01L 51/5246; H01L 51/5253; H01L 51/5262; H01L 51/5271; H01L 51/5281; H01L 51/56; H01L 2221/1005; H01L 2221/1052; H01L 2224/022–02215; H01L 2251/558; H01L 2251/301; H01L 2251/556; H01L 2251/56; H01L 2924/351; H01L 2924/364; H01L 2933/0025
USPC ........... 257/98, 99, 100, 88, 89; 438/26, 127
See application file for complete search history.

(56) References Cited

U.S. PATENT DOCUMENTS

| | | | | |
|---|---|---|---|---|
| 2003/0189217 | A1* | 10/2003 | Imai | H01L 33/44 257/99 |
| 2005/0093008 | A1* | 5/2005 | Suehiro | H01L 33/44 257/98 |
| 2005/0126697 | A1* | 6/2005 | Kuczynski | C08G 59/18 156/275.7 |
| 2006/0189013 | A1* | 8/2006 | Schardt | H01L 33/54 438/26 |
| 2007/0182323 | A1* | 8/2007 | Ogata | H01L 33/56 313/512 |
| 2008/0160322 | A1* | 7/2008 | Mochizuki | C08L 83/04 428/447 |
| 2010/0155749 | A1* | 6/2010 | Chen | C09K 11/025 257/89 |
| 2010/0209670 | A1 | 8/2010 | Suehiro et al. | |
| 2013/0186467 | A1* | 7/2013 | Saeki | B29C 33/424 136/259 |
| 2014/0042426 | A1* | 2/2014 | Nishimura | H01L 51/5275 257/40 |

FOREIGN PATENT DOCUMENTS

| | | |
|---|---|---|
| JP | 2009-147329 A | 7/2009 |
| JP | 2011-003870 A | 1/2011 |
| JP | 2015-002298 A | 1/2015 |
| JP | 2015-043363 A | 3/2015 |

* cited by examiner

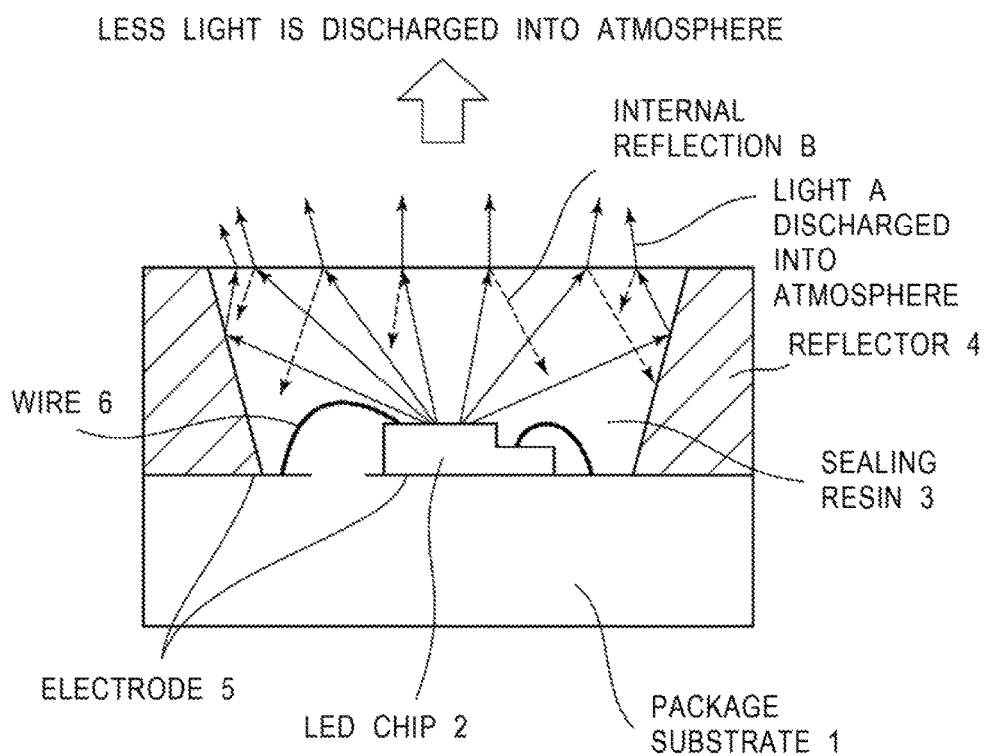
FIG.3 — RELATED ART

LED MODULE AND METHOD FOR MANUFACTURING LED MODULE

TECHNICAL FIELD

The present invention relates to an LED module, the light extraction efficiency of which has been improved, and a method for manufacturing the same.

BACKGROUND ART

In general, an LED module in which an LED chip is sealed with a resin is widely used as a lighting fixture. In the general structure of the LED module, an LED chip 2 is mounted on an electrode 5 of a package substrate 1, an electrode of the LED chip 2 and the electrode 5 of the package substrate 1 are electrically connected to each other by a wire 6, a reflector 4 that reflects light is disposed around the LED chip 2, and the inner circumferential surface of the reflector 4, the wire 6, the LED chip 2, and the electrode 5 of the package substrate are filled with a sealing resin 3, as in a sectional view shown in FIG. 3.

Light emitted from the LED chip 2 is reflected by the reflector 4 or goes straight to pass through the sealing resin 3, and is discharged into the atmosphere from a substantially flat surface of the sealing resin 3. There is such a problem that at this time, more light is subject to internal reflection B by the surface of the sealing resin 3 due to a difference in refractive index between the atmosphere and the sealing resin 3, as shown in FIG. 3, and a loss occurs in the output of light A discharged into the atmosphere.

Japanese Patent Laying-Open No. 2009-147329 describes texturing a surface of the sealing resin in order to reduce internal reflection of light at a sealing body of the LED module to reduce the loss in the output of the light discharged into the atmosphere.

PRIOR ART

Patent Document

Patent Document 1: Japanese Patent Laying-Open No. 2009-147329

SUMMARY OF THE INVENTION

Problem to be Solved by the Invention

However, Patent Document 1 does not specifically show modes such as a concrete texturing method and a material at an interface with the atmosphere, and hence the modes are unclear.

The present invention aims to embody modes to solve such a problem that a loss in the output of light discharged into the atmosphere occurs in an LED module.

Means for Solving the Problem

In order to solve the aforementioned problem, the present invention provides an LED module in which an LED chip is sealed with a sealing resin, a surface of the sealing resin is covered with a thin film, the thin film is made of a material having a smaller linear expansion coefficient than the sealing resin, and an irregular surface is provided on a surface of the thin film such that light from the LED chip is multiply reflected.

According to this structure, an angle at which the light emitted from the LED chip is internally reflected on the surface of the sealing resin becomes diversified and complicated (i.e., multiply reflected), the probability of discharging the light to the atmosphere is improved, and a loss in the output of the light into the atmosphere is reduced such that the light extraction efficiency can be improved.

The thin film may be formed on the surface of the sealing resin under a heating condition, and thereafter may be restored to room temperature such that irregularities are formed on the surface of the thin film.

According to this structure, in a state where the sealing resin having a large linear expansion coefficient expands due to heating, the thin film is formed on the surface of the sealing resin such that the thin film shrinks due to the sealing resin that shrinks when the sealing resin is restored to room temperature, and irregularities can be relatively easily formed on the surface of the thin film.

The thin film may include an oxide film made of an inorganic material.

According to this structure, the loss in the output of the light discharged into the atmosphere is reduced such that the light extraction efficiency can be improved, and corrosion of an electrode caused by penetration of moisture or air into the sealing resin can be prevented.

The thin film may be formed by laminating a buffer film made of an inorganic material between the oxide film and the sealing resin.

According to this structure, the adhesion between the oxide film and the sealing resin is improved such that more irregularities can be formed without occurrence of cracks even when the temperature during film formation is high.

In order to solve the aforementioned problem, the present invention provides a method for manufacturing an LED module, including sealing an LED chip mounted on a package substrate with a sealing resin and forming a thin film on a surface of the sealing resin under a heating condition after the sealing, in which the LED module is restored to room temperature after the forming such that irregularities are formed on a surface of the thin film, and light from the LED chip is multiply reflected.

In the LED module manufactured by this manufacturing method, an angle at which the light emitted from the LED chip is reflected on an interface with the atmosphere becomes diversified and complicated (i.e., multiply reflected), and a loss in the output of light discharged into the atmosphere is reduced such that the light extraction efficiency can be improved.

Effect of the Invention

As described above, due to the LED module in which the LED chip is sealed with the sealing resin, the surface of the sealing resin is covered with the thin film, the thin film is made of the material having a smaller linear expansion coefficient than the sealing resin, and the irregular surface is provided on the surface of the thin film such that the light from the LED chip is multiply reflected, the light emitted from the LED chip is multiply reflected on the surface of the sealing resin, and the loss in the output of the light discharged into the atmosphere is reduced such that the light extraction efficiency can be improved.

Due to the method for manufacturing an LED module, including sealing the LED chip mounted on the package substrate with the sealing resin and forming the thin film on the surface of the sealing resin under the heating condition after the sealing, in which the LED module is restored to room temperature after the forming such that irregularities are formed on the surface of the thin film, and the light from the LED chip is multiply reflected, the light emitted from the LED chip is multiply reflected on the surface of the sealing resin, and the loss in the output of the light discharged into the atmosphere is reduced such that the light extraction efficiency can be improved.

BRIEF DESCRIPTION OF THE DRAWINGS

FIG. 3 A diagram for illustrating a cross-section and light emission of a conventional LED module.

MODES FOR CARRYING OUT THE INVENTION

First Embodiment (LED Module)

Figure 1:
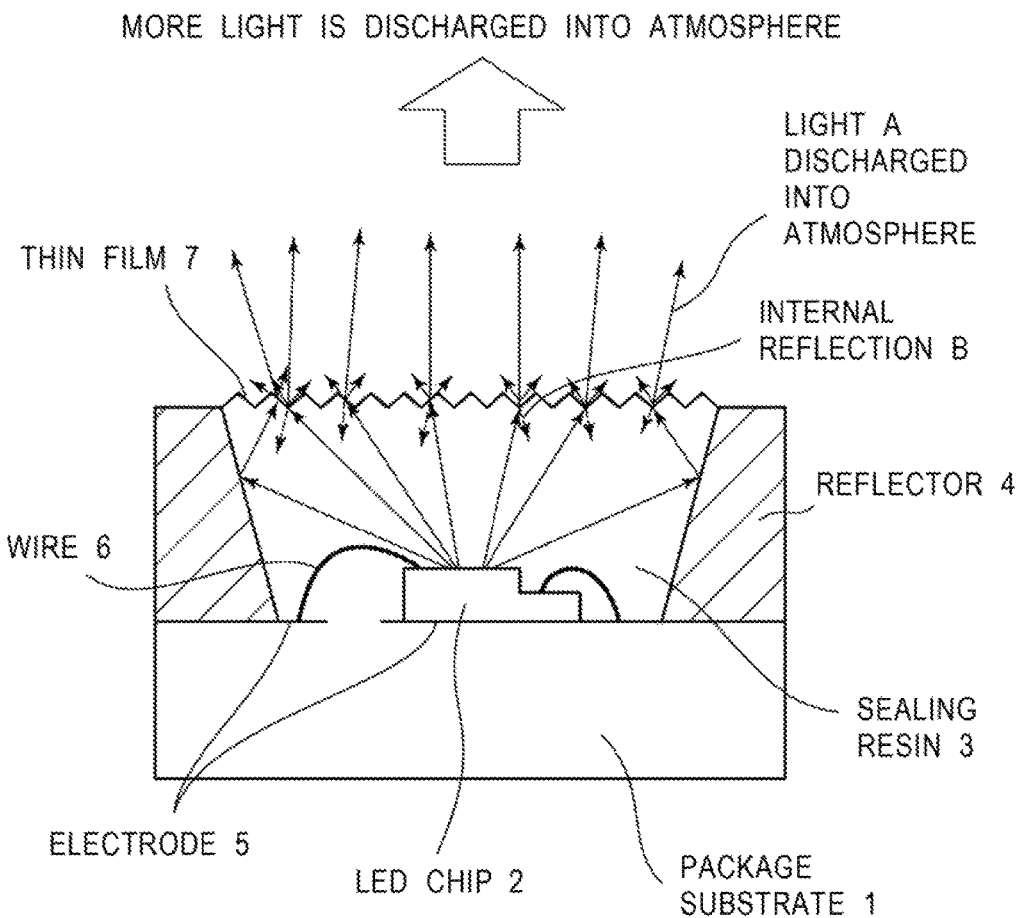
FIG. 1 A diagram for illustrating a cross-section and light emission of an LED module according to an embodiment of the present invention.

The structure of an LED module according to a first embodiment of the present invention is described with reference to FIG. 1. FIG. 1 shows a cross-section of the LED module. An LED chip 2 is mounted on an electrode 5 of a package substrate 1, and an electrode of the LED chip 2 and the electrode 5 of the package substrate are electrically connected to each other by a wire 6. A reflector 4 made of ceramic or the like is disposed around the LED chip 2 and reflects a portion of light emitted from the LED chip 2 to the atmosphere such that more light is discharged from the LED module.

Although the electrode of the LED chip 2 and the electrode 5 of the package substrate 1 are connected to each other by the wire 6 according to the first embodiment, the present invention is not necessarily restricted to this, and the LED chip 2 may be flip-chip bonded to the electrode 5 of the package substrate 1 such that the electrode of the LED chip 2 and the electrode 5 of the package substrate 1 are electrically connected to each other without using the wire 6.

A space surrounded by the reflector 4, the LED chip 2, and the package substrate 1 is filled with a sealing resin 3 made of a silicone resin, and is sealed from the atmosphere. A boundary between the sealing resin 3 and the atmosphere is covered with a thin film 7, and includes an irregular surface.

The thin film 7 is formed as an oxide film made of an inorganic material. The thin film 7 is also made of a material having a smaller linear expansion coefficient than the sealing resin 3. More specifically, the linear expansion coefficient of the thin film 7 is preferably from 1 to 10 ppm/° C., and the linear expansion coefficient of the sealing resin 3 is preferably from 100 to 500 ppm/° C.

The thickness of the thin film 7 may be about 1 μm, and may also be more than this or less than this.

The refractive index of the thin film 7 is preferably equal to that of the sealing resin 3, or preferably has a value between the refractive index of the atmosphere and the refractive index of the sealing resin 3.

Although the thin film 7 is made of $SiO_2$ according to the first embodiment, the present invention is not necessarily restricted to this, and the thin film 7 may be an oxide film made of another inorganic material having a smaller linear expansion coefficient than the sealing resin 3. For example, the thin film 7 may be made of $Al_2O_3$.

The thin film 7 is formed of the material having a smaller linear expansion coefficient than the sealing resin 3 under heating such that the thin film 7 wrinkles due to shrinkage of the sealing resin 3 that has expanded when the sealing resin 3 is restored to room temperature, and hence irregularities having heights of about 1 to 200 μm can be relatively easily formed on a surface of the thin film 7.

Incidentally, the inorganic material denotes a material other than an organic material, and specifically, the inorganic material denotes a material having no carbon skeleton and having a small linear expansion coefficient. That is, the inorganic material does not include synthetic/natural resins or other compounds having carbon skeletons (including hydrocarbon skeletons).

In particular, an oxide film made of an inorganic material has a strong bonding force and a high barrier property. In addition, cracks are unlikely to occur due to a high bonding force. That is, the thin film 7 including irregularities on its surface is formed as an oxide film made of an inorganic material such that a loss in the output of light discharged into the atmosphere can be reduced to improve the light extraction efficiency, and corrosion of the electrode caused by penetration of moisture or air into the sealing resin can be prevented.

The light emitted from the LED chip 2 passes through the sealing resin 3 or is reflected by the reflector to reach the irregular surface of the thin film 7. The light is repetitively complexly reflected in various directions (i.e., multiply reflected) by the irregular surface of the thin film 7 such that internal reflection B is significantly reduced, and more light A is discharged into the atmosphere, and hence the light extraction efficiency can be improved.

(Manufacturing Method)

A method for manufacturing the LED module according to the present invention is now described. In the LED module in which the LED chip 2 is mounted on the electrode 5 of the package substrate 1 including the reflector 4, the electrode of the LED chip and the electrode of the substrate are electrically connected to each other by the wire 6, and the space is filled with the sealing resin 3, as in FIG. 1, the thin film 7 is formed on a surface of the sealing resin 3 by a plasma CVD apparatus.

At this time, the LED module is heated such that the sealing resin 3 expands. An oxide film of an inorganic material made of $SiO_2$ having a smaller linear expansion coefficient than the sealing resin 3 is formed as the thin film 7 on the surface of the expanding sealing resin 3. Then, when the LED module is removed from the plasma CVD apparatus and is restored to room temperature, the sealing resin 3 having a larger linear expansion coefficient shrinks such that the formed oxide film of the inorganic material made of $SiO_2$ also shrinks due to this. The linear expansion coefficient of $SiO_2$ is smaller than that of the sealing resin 3, and hence $SiO_2$ having nowhere to go wrinkles such that fine irregularities are formed.

Figure 2:
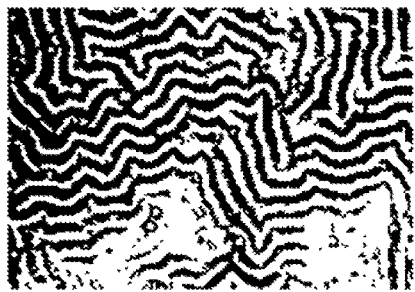
FIG. 2 A photograph showing irregularities formed on a thin film surface according to the present invention.

FIG. 2 shows a state where $SiO_2$ wrinkles and irregularities are formed. In the case of $SiO_2$, the thin film 7 is formed while being heated to 40° C. to 130° C., and thereafter is restored to room temperature such that the irregular surface (wrinkles) can be formed as in FIG. 2.

In the case of $SiO_2$, when the heating temperature is higher than 130° C., cracks occur in the thin film 7 when the thin film 7 is restored to room temperature. When the heating temperature is lower than 40° C., irregularities are not formed.

Although plasma CVD is used to form the thin film 7, which is an oxide film of an inorganic material made of $SiO_2$, the present invention is not necessarily restricted to this, and a sputtering apparatus, a deposition apparatus, or the like can be used so far as a film is formed under heating.

The oxide film of the inorganic material is not restricted to $SiO_2$, and even when $Al_2O_3$ having a smaller linear expansion coefficient than the sealing resin 3 made of a silicone resin is used, irregularities (wrinkles) can be similarly formed on the surface of the thin film 7 by the same manufacturing method.

Second Embodiment (LED Module)

An LED module according to a second embodiment of the present invention is different from the first embodiment in that a thin film 7 has a layered structure. That is, a buffer layer, which is an insulating film made of an inorganic material, is formed on a surface of a sealing resin 3, and an oxide film made of an inorganic material is further formed on a surface thereof. In other words, the buffer layer, which is an insulating film made of an inorganic material, is laminated between the oxide film made of an inorganic material and the sealing resin 3.

The buffer layer is a film having a lower barrier property than the above-described oxide film and a higher adhesion than the above-described oxide film, and is an inorganic material made of a material having a smaller linear expansion coefficient than the sealing resin 3. Specifically, the buffer layer may be a silicon-based film containing H, C, and Si. More specifically, although the buffer layer may be a SiCN film, the present invention is not necessarily restricted to this, and the buffer layer may be a SiN film or a SiON film.

The buffer layer made of an inorganic material is laminated between the sealing resin 3 and the oxide film made of an inorganic material such that the adhesion with the sealing resin 3 can be improved. The adhesion with the sealing resin 3 is improved such that the heating temperature during film formation in which irregularities can be formed on the thin film 7 without occurrence of cracks can be higher than 130° C.

Also according to the second embodiment, light emitted from an LED chip 2 passes through the sealing resin 3 or is reflected by a reflector to reach an irregular surface of the thin film 7. The light is repetitively complexly reflected in various directions (i.e., multiply reflected) by the irregular surface of the thin film 7 such that internal reflection B is significantly reduced, and more light A is discharged into the atmosphere, and hence the light extraction efficiency can be improved.

Also according to the second embodiment, the oxide film made of an inorganic material in the thin film 7 is made of $SiO_2$. However, the present invention is not necessarily restricted to this, and an oxide film made of another inorganic material having a smaller linear expansion coefficient than the sealing resin 3 may be used. For example, the oxide film may be made of $Al_2O_3$.

Although one buffer layer and one oxide film are layered according to the second embodiment, the present invention is not restricted to this, and a plurality of buffer layers and a plurality of oxide films may be alternately layered. Thus, the barrier property can be increased while the adhesion is maintained.

(Manufacturing Method)

In the LED module in which the LED chip 2 is mounted on an electrode 5 of a package substrate 1 including the reflector 4, an electrode of the LED chip and the electrode 5 of the substrate are electrically connected to each other by a wire 6, and its space is filled with the sealing resin 3, the buffer layer, which is an insulating layer made of an inorganic material, is first formed on the surface of the sealing resin 3 by a plasma CVD apparatus. The buffer layer can be SiCN. This buffer layer is formed such that the adhesion with the sealing resin 3 made of a silicone resin can be improved.

Then, the oxide film of an inorganic material made of $SiO_2$ is formed on the surface of the buffer layer in the same plasma CVD apparatus such that the thin film 7 includes the buffer layer made of SiCN and the oxide film made of $SiO_2$.

When the LED module is removed from the plasma CVD apparatus and is restored to room temperature, the sealing resin 3 made of a silicone resin having a large linear expansion coefficient shrinks such that the formed oxide film of an inorganic material made of $SiO_2$ and the formed buffer layer made of SiCN also shrink due to this. The linear expansion coefficients of $SiO_2$ and SiCN are smaller than that of the sealing resin 3 made of a silicone resin, and hence $SiO_2$ and SiCN having nowhere to go wrinkle such that irregularities are formed.

Accordingly, the light emitted from the LED chip 2 passes through the sealing resin 3 or is reflected by the reflector to reach the irregular surface of the thin film 7. The light is repetitively complexly reflected in various directions (i.e., multiply reflected) by the irregular surface of the thin film 7 such that the internal reflection B is significantly reduced, and more light A is discharged into the atmosphere, and hence the light extraction efficiency can be improved.

Although the electrode of the LED chip 2 and the electrode 5 of the package substrate 1 are connected to each other by the wire 6 also according to the second embodiment, the present invention is not necessarily restricted to this, and the LED chip 2 may be flip-chip bonded to the electrode 5 of the package substrate 1 such that the electrode of the LED chip 2 and the electrode 5 of the package substrate 1 are electrically connected to each other without using the wire 6.

Also according to the second embodiment, an apparatus used to form the thin film 7 is not restricted to the plasma CVD apparatus, and a sputtering apparatus, a deposition apparatus, or the like can be used so far as a film is formed under heating.

The oxide film of an inorganic material is not restricted to $SiO_2$, and even when $Al_2O_3$ is used, irregularities (wrinkles) can be formed on the surface of the thin film 7 by the same manufacturing method.

INDUSTRIAL APPLICABILITY

The present invention can be widely applied to an LED module and a method for manufacturing an LED module.

DESCRIPTION OF REFERENCE NUMERALS

1: package substrate
2: LED chip
3: sealing resin
4: reflector
5: electrode
6: wire
7: thin film
A: light discharged into the atmosphere
B: internal reflection

The invention claimed is:

1. A light emitting diode (LED) module in which an LED chip is sealed with a sealing resin, wherein
   a surface of the sealing resin is covered with a thin film having a thickness of less than about 1 m,
   the thin film is made of a material having a smaller linear expansion coefficient than the sealing resin, and
   the thin film has a wrinkled irregular surface having heights of about 1 μm to 200 μm in a whole of the thin film including both a top surface and a bottom surface such that light from the LED chip is multiply reflected,
   wherein the thin film includes an oxide film made of an inorganic material and a buffer film made of an inorganic material laminated between the oxide film and the sealing resin, and
   the buffer film has a lower barrier property than the oxide film and a higher adhesion than the oxide film.

2. A method for manufacturing a light emitting diode (LED) module, comprising:
   sealing an LED chip mounted on a package substrate with a sealing resin;
   expanding the sealing resin by heating the LED module to a prescribed heating condition;
   forming a buffer film made of an inorganic material on a surface of the sealing resin by chemical vapor deposition, sputtering, or deposition under the heating condition after the expanding;
   forming an oxide film made of an inorganic material on a surface of the buffer film, by chemical vapor deposition, sputtering, or deposition under the heating condition after the expanding; and
   shrinking the sealing resin such that a shrinkage amount of the sealing resin is larger than a shrinkage amount of a thin film including the buffer film and the oxide film due to a difference of linear expansions between the thin film and the sealing resin, by restoring the LED module to room temperature from the heating condition, to form a wrinkled irregular surface that light from the LED chip is multiply reflected in the surface of the thin film on the sealing resin,
   wherein the buffer film has a lower barrier property than the oxide film and a higher adhesion than the oxide film, and
   the thin film has a thickness of less than about 1 μm made of a material having a smaller linear expansion coefficient than the sealing resin.

* * * * *